United States Patent [19]
Baxter

[11] 4,111,717

[45] Sep. 5, 1978

[54] SMALL-SIZE HIGH-PERFORMANCE RADIATION THERMOPILE

[75] Inventor: Ronald Dale Baxter, Furlong, Pa.

[73] Assignee: Leeds & Northrup Company, North Wales, Pa.

[21] Appl. No.: 811,373

[22] Filed: Jun. 29, 1977

[51] Int. Cl.$^2$ .......................................... H01L 35/32
[52] U.S. Cl. .................................... 136/225; 29/573; 73/355 R; 136/208; 136/213
[58] Field of Search .................. 73/355 R; 29/573; 136/208, 213, 225

[56] References Cited

U.S. PATENT DOCUMENTS

| 3,405,271 | 10/1968 | Stevens et al. ................. | 136/225 X |
| 3,424,624 | 1/1969 | Villers et al. ........................ | 136/213 |

OTHER PUBLICATIONS

Semiconductors and Semimetals, vol. 5, edited by R. K. Willardson, Academic Press, New York, 1970, pp. 307 to 316.

*Primary Examiner*—Leland A. Sebastian
*Attorney, Agent, or Firm*—Raymond F. MacKay; William G. Miller, Jr.

[57] ABSTRACT

A thermopile type radiation detector for use in radiation pyrometry having small size and high performance in which the thermopiles are formed by evaporating the thermocouple leads onto a thin substrate together with a pattern distribution of thermocouple junctions that produces an output that is more representative of the distributed radiant energy impinging on the hot junctions of the thermopile. The thermopile performance is improved also by the incorporation of relatively large reflecting areas associated with the region of the thermopile where the cold junctions are located.

9 Claims, 4 Drawing Figures

4,111,717

SMALL-SIZE HIGH-PERFORMANCE RADIATION THERMOPILE

BACKGROUND OF THE INVENTION

In the early form of the thermopile type radiation pyrometer the target area upon which the radiation was directed and which contained the hot junctions of the thermopile was spatially supported by the thermocouple wires in order to reduce to a minimum the thermal conductivity from the hot junctions on the target area to the cold junctions associated with the body or case of the radiation pyrometer. More recently, attention has been paid to an arrangement referred to as a solid-backed thermopile in which a thin insulating layer extends across an opening in a support frame and in which the thermopile is formed by depositing on the insulating layer a series of thermocouple junctions with the hot junctions located in an area in the center of a central opening in the frame and the cold junctions located in an area corresponding with the frame material. U.S. Pat. Nos. 3,424,624 issued to P. Villers et al and 3,405,273 issued to N. B. Stevens et al disclose two different approaches to the solid-backed thermopile. The common material, as shown in these two patents for the thin insulating film, has been either Mylar film or a film of aluminum oxide. In constructing thermopiles of this type it has been the practice to attach the supporting film by means of an adhesive to the supporting frame although aluminum oxide films have been prepared by anodizing a block of aluminum and etching away the central portion of aluminum to form an unsupported film of aluminum oxide. In order to obtain the maximum output from the thermopile for the number of thermopile junctions, the material generally used in this type of device are bismuth and antimony because of their large Seebeck coefficients. U.S. Pat. No. 3,424,624 discusses the construction of a thermopile indicating that the radial thermopile is the conventional arrangement although thermopiles may be arranged with the junctions in rows such as shown in U.S. Pat. No. 3,405,273.

The performance of a thermopile radiation detector is in general measured by the voltage output from the thermopile per watt of radiant energy received and also the time constant of response for the thermopile. Quite obviously, a low-time constant and a large voltage output per watt of received energy are the objectives in any design. In a solid-backed thermopile this performance is, to large measure, determined by the number of thermocouple junctions that can be located in the active target area and the amount of conductivity of heat from the hot junctions to the cold junctions through the insulating layer, as well as the more conventional problem of dissipating heat from the cold junction region.

SUMMARY OF THE INVENTION

The present invention is directed to a miniature radiation sensitive thermopile for use in radiation pyrometers that is of a unique design to provide a high performance thermopile and the method for making such a thermopile.

In the thermopile of this invention the pattern of the thermocouple junctions is arranged so that the thermocouple hot junctions are distributed throughout the target area rather than located on the periphery of the target area as is characteristic in a radial type of pattern. Furthermore, the hot junctions are not limited to a single straight line arrangement as normally found in those thermocouples wherein the junctions are arranged in a row across the target area. The uniqueness of the pattern of hot junctions in the target area is accomplished by arranging the thermocouple leads to the hot junctions such that the leads for any one hot junction are at substantially right angles to each other. It will be readily apparent that for any given thermocouple lead size and spacing the number of thermocouple junctions with such an arrangement is twice the number of junctions that could be obtained for an arrangement in which the hot junctions are formed with the thermocouple leads extending in opposite directions from the hot junctions in the convential pattern. Not only does this pattern result in an increased number of hot junctions in the target area and therefore an increase in output of the thermopile, it also produces a pattern which is uniquely symmetrical. Such symmetry is of concern and importance when dealing with thin film supporting material in order to prevent the setting up of stresses within the film.

In addition to the arrangement which permits the maximization of the number of hot junctions in the target area for any particular target area and lead spacing, the thermopile also features reflector areas associated with the cold junctions of the thermopile. These reflective areas help to maintain the region of the cold junctions at a relatively low temperature in order to insure a maximum output from the thermopile when the target area is subjected to an impinging radiant energy level by reflecting stray radiant energy from the region of the cold junctions that would otherwise be absorbed and increase the temperature of the cold junctions.

While the structural features of the thermopile are distinctly different from the features encountered in the prior art, the method of making the thermopile itself also departs from the teachings of the prior art. In the method of this invention the thin film support for the thermopile is not cemented by an adhesive to a supporting frame but rather is formed by depositing a thin insulating film on a wafer having a particular crystal orientation and in the process of manufacture removing by an orientation dependent etch the material of the wafer in the region of the target area so that the hot junctions are on a portion of the supporting film or web that is isolated from the supporting wafer and the cold junctions are located on the film or web in a region where it is supported by the support member.

DESCRIPTION OF THE PREFERRED EMBODIMENTS

Figure 1:
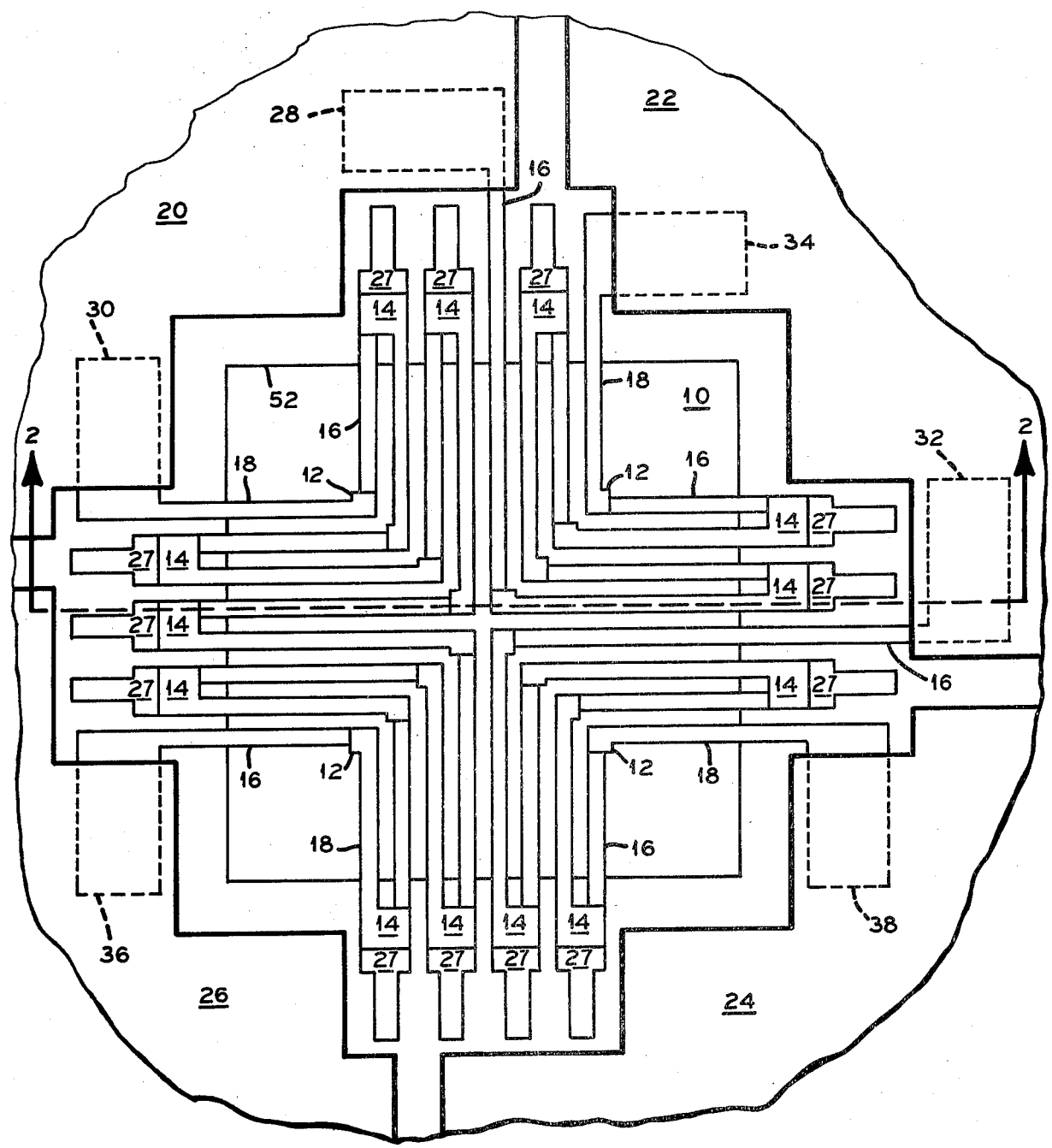
FIG. 1 is an enlarged plan view of a partially completed thermopile constructed in accordance with the invention.

In FIG. 1 there is shown a thermopile 10 having sixteen hot junctions 12 located in a central or target area of the thermopile 10. There is also disclosed a series of cold junctions 14 peripherally located about the outer edge of the thermopile 10. These hot and cold thermocouple junctions 12 and 14 are formed by the joining together of two electrical conductors of different composition. While it is known that many different types of conductors may be used to produce a thermocouple junction, in a preferred embodiment of this invention, it has been found that optimum results may be obtained by using conductors of constantan and an alloy of 80% nickel and 20% chromium such as Nichrome. In FIG. 1 conductors 16 denote the constantan conductor whereas conductors 18 denote the Nichrome conductors. It will be noted that thirteen of the cold junctions 14 are formed by junctions between the constantan conductors 16 and the Nichrome conductors 18. There are, however, in the thermopile configuration of FIG. 1 two cold junctions which are formed using an intermediate conductor. Four large areas 20, 22, 24 and 26 of a highly reflective electrical conducting material such as gold serve a dual purpose in the construction of the thermopile in that they serve as electrical contacting elements and also as heat reflectors to protect the heat sink with which the cold junctions 14 are associated from stray radiant energy. It will be noted particularly that area 20 is in electrical conducting relation between a constantan pad connecting area 28 and a nichrome pad connecting area 30. This gold area 20 thus serves as a connection between the pad area 28 and the pad area 30 to provide a thermoelectric cold junction, comprised of two separate junctions in series; namely, a constantan-gold junction at pad 28 and a Nichrome-gold junction at pad 30. As gold is one element of each junction it will be understood that the net effect will be that of a constantan-Nichrome cold junction. Similarly, gold area 22 serves as a connection between a constantan pad connecting area 32 and a Nichrome pad connecting area 34. Gold area 24 cooperates with a Nichrome pad connecting area 38 to provide for one output connection for the thermopile 10, whereas gold area 26 cooperates with a constantan pad connecting area 36 to provide the other output terminal for the thermopile 10. These areas 24 and 26 are connected to the ends of appropriate leads 40 and 41 (FIG. 1A) secured into a base 44 by a cement 46. The connection from the pad 24 to the lead 40 is by way of a wire 48 and the connection from the area 26 to the lead 42 is by way of a wire 50.

In addition to the large areas 20, 22, 24 and 26 of gold applied to improve the reflectivety of the cold junction region there is also associated with each of the cold junctions 14 a smaller reflective area 27 that overlies a portion of the cold junction 14 and extends over a portion of the thin film of insulating material 54. This area 27 not only further reduces the influence of stray radiation on the cold junctions 14 but also aids in securing the cold junctions 14 to the film 54 to improve the heat sink characteristics of the film 54.

In describing the thermopile 10, it has been indicated that there are sixteen hot junctions 12 for the measurement of the impinging radiation. It is, of course, not necessary to limit the thermocouple to any particular number of junctions and the pattern could be extended further, the only limitation on the number of junctions being the size of the target area the size of the leads and junctions and the required spacing between the thermocouple leads.

Figure 2:
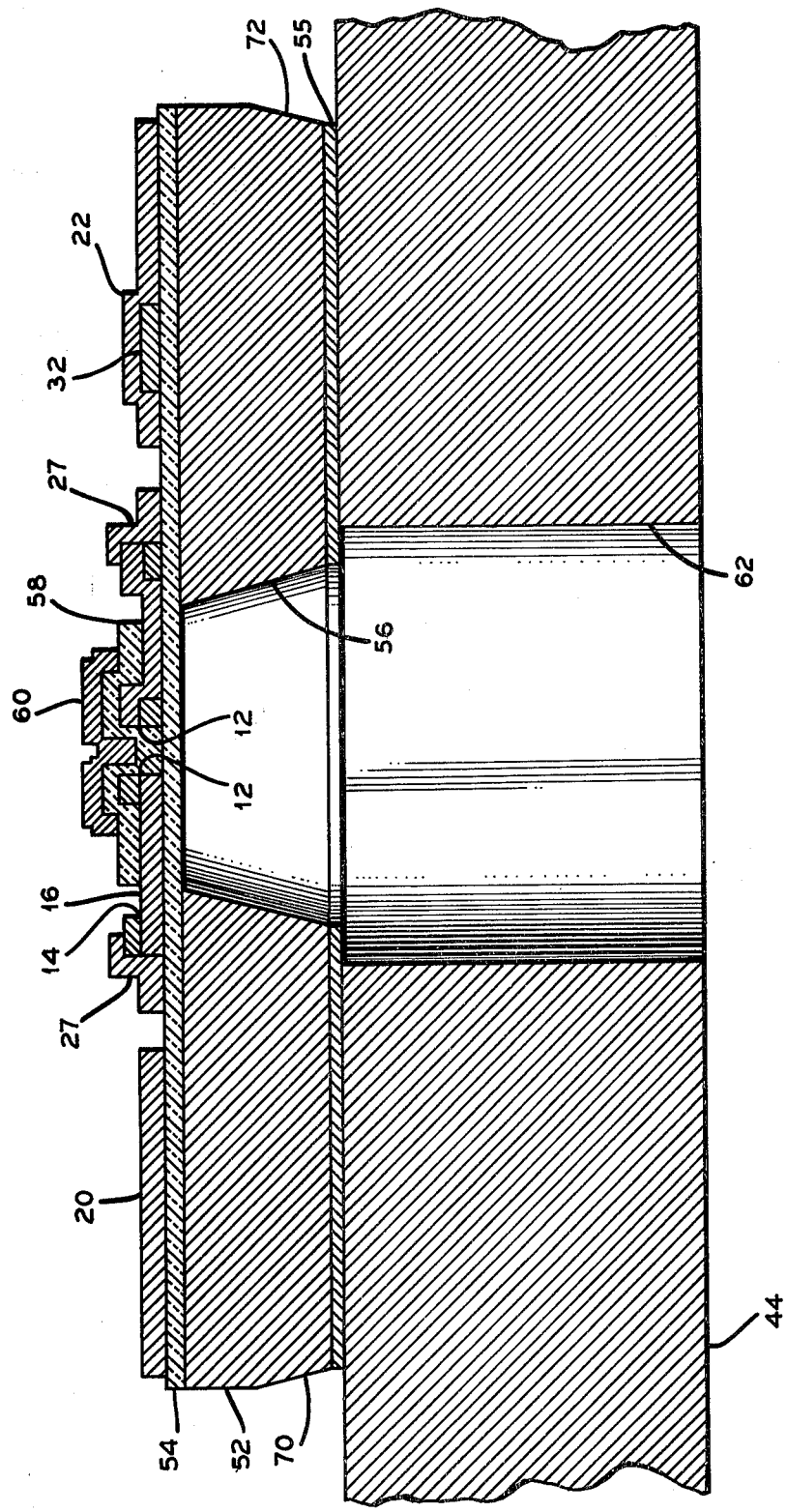
FIG. 2 is a cross-sectional view of a completed thermopile taken along the line shown in FIG. 1.

The novel method of manufacture of the radiation detector including the thermopile 10 can best be understood by reference to FIG. 2 showing a cross-sectional view of a completed thermopile 10. The manufacture begins with a wafer of a crystalline substance having a (1-0-0) crystal orientation which, in the final product, forms a supporting frame 52. In the preferred embodiment of this invention the crystalline substance is silicon. To the front surface of the silicon wafer 52 there is deposited by any of the well-known methods of deposition a thin film 54 of a suitable insulating material. It is important that the insulating material have physical properties such that the bonding between the insulating material and the supporting frame will not be disturbed by the changes in temperature of the device during the manufacturing process. To this end it has been found that a borosilicate glass having a thickness of 10,000 Angstroms is suitable for use with a silicon supporting frame 52. After the borosilicate glass film 54 has been bonded to the silicon supporting frame 52 by deposition, the combination is subjected to an annealing operation to remove all stresses that might be present in the thin film 54 of borosilicate glass caused by the step of depositing the glass on the silicon supporting frame 52.

Using well-known photolithographic techniques, the thermocouples are formed on the exposed surface of the thin film of insulating material 54. Specifically, the exposed surface of the borosilicate glass 54 is covered with a photoresist which is exposed through an appropriate mask representing the pattern structure for the constantan conductors 16 of the thermocouples. Each of these conductors 16 is composed of a lead portion having a width of 0.0006 inches and terminate in enlarged pad areas for connection to form the hot and cold thermocouple junctions 12 and 14. After development of the photoresist resulting in removal of the photoresist from the areas in which the constantan conductors 16 are to be located, constantan of a thickness of 1,000–2,000 Angstroms is deposited over the entire surface of the glass film 54. The exposed surface is then subjected to a commercial photoresist stripper which removes the all of the remaining photoresist from the front surface and the constantan that was deposited thereon. There thus results a pattern of constantan conductors 16 having fine lead portions and enlarged junction portions. The same procedure is repeated for depositing the Nichrome conductors 18 onto the surface of the glass film and to overlay the constantan conductors to form the hot and cold thermocouple junctions 12 and 14 of the thermopile 10.

Referring to FIG. 1, the preceding deposition of the constantan and the Nichrome conductors 16 and 18 on the face of the thin glass substrate 54, has produced a series of sixteen hot junctions 12 of the thermopile 10. In addition, thirteen cold junctions 14 have been formed and there is thereby produced three separate groups of series connected hot and cold junctions 12 and 14. A first group consisting of eight hot junctions 12 and seven cold junctions 14 are located between the constantan pad 36 and the nichrome pad 30. Between the constantan pad 28 and the Nichrome pad 34 there is located another series of thermocouple junctions having four hot junctions 12 and three cold junctions 14. Finally, between the constantan pad 32 and the Nichrome pad 38 there is produced another thermocouple group of four hot junctions 12 and three cold junctions 14.

The next step in the method of manufacturing the thermopile is to provide interconnections between the individual groups of thermocouple junctions to provide a single thermopile having sixteen hot junctions connected in series and to provide appropriate contact provisions to the thermopile itself. To this end the front surface of film 54 is covered with a photoresist. The photoresist is exposed through a mask to produce exposed areas 20, 22, 24, 26 and 27 of FIG. 1. The photoresist is developed which selectively removes the exposed photoresist. There is then deposited a thin layer of chromium to a thickness of approximately 400 Angstroms over the entire surface of the film 54. On top of the layer of chromium there is deposited a layer of gold having a thickness of approximately 4,000 Angstroms. The surface is then subjected to a photoresist stripper solution to remove the remaining photoresist together with the chromium and gold layers on top of the photoresist to form the pattern of four large areas 20, 22, 24 and 26 having a large gold surface and the smaller areas 27 associated with the cold junctions 14 as shown in FIG. 1. As previously pointed out, the area 20 provides a connection between the Nichrome pad 30 and the constantan pad 28 to provide a cold junction and also a connection between two of the groups of the thermocouple junctions. The area 22 provides an electrical connection from the Nichrome pad 34 to the constantan pad 32 to produce a connection between groups of thermocouple junctions and to provide a required cold junction. Additionally, it will be observed that area 26 provides an electrical connection to the constantan pad 36 and area 24 provides a connection to the Nichrome pad 38.

The foregoing steps in the manufacture of the thermopile has been related to the operations performed on the exposed surface of glass film 54 on the silicon-supporting frame 52. In order to provide the thin web of insulating material to support the thermopile, it is necessary to remove from the silicon wafer 52 the material directly beneath the target area which includes the sixteen hot junctions 12. In order to produce a sharply defined and accurately controlled central aperature 56 in the supporting frame 52, a layer of chromium approximately 400 Angstroms thick is first deposited on the surface of the silicon wafer followed by a layer 55 of gold having a thickness of approximately 4,000 Angstroms. The exposed surface of gold layer 55 is covered with a thin film of photoresist and exposed through an appropriate mask to ultraviolet light. The exposed photoresist is developed to remove the photoresist from the gold layer in the area to correspond with the aperature 56. The exposed gold layed is subjected to an acid etch which removes the exposed gold layer 55 and the thin layer of chromium located beneath the gold to expose the silicon. The exposed silicon is subjected to an anisotropic etch which, in view of the crystal orientation of the silicon wafer provides a controlled etch resulting in an aperature 56 which is substantially rectangular in shape as defined by the 1-1-1 planes in the silicon wafer. The outline of aperature 56 at the rear surface of the thin film of borosilicate glass 54 has precisely defined sides in the area of the hot junctions or target area of the thermopile required by the small size of the apparatus.

In order to provide an improved response of the thermopile 10, the target area is provided with a receptor material to increase the absorption of radiation impinging thereon. A mask is placed over the face of the thermopile 10 shown in FIG. 1 with a hole in the mask positioned over the aperature 56. A thin film 58 of borosilicate glass is deposited through the hole in the mask onto the target area of the thermopile 10 including the hot junctions 12. Following that, a mask with a smaller opening is located over the thermopile 10 and a film 60 of metal black is deposited through the mask onto the film 58 to define the target area of the thermopile 10.

Figure 1A:
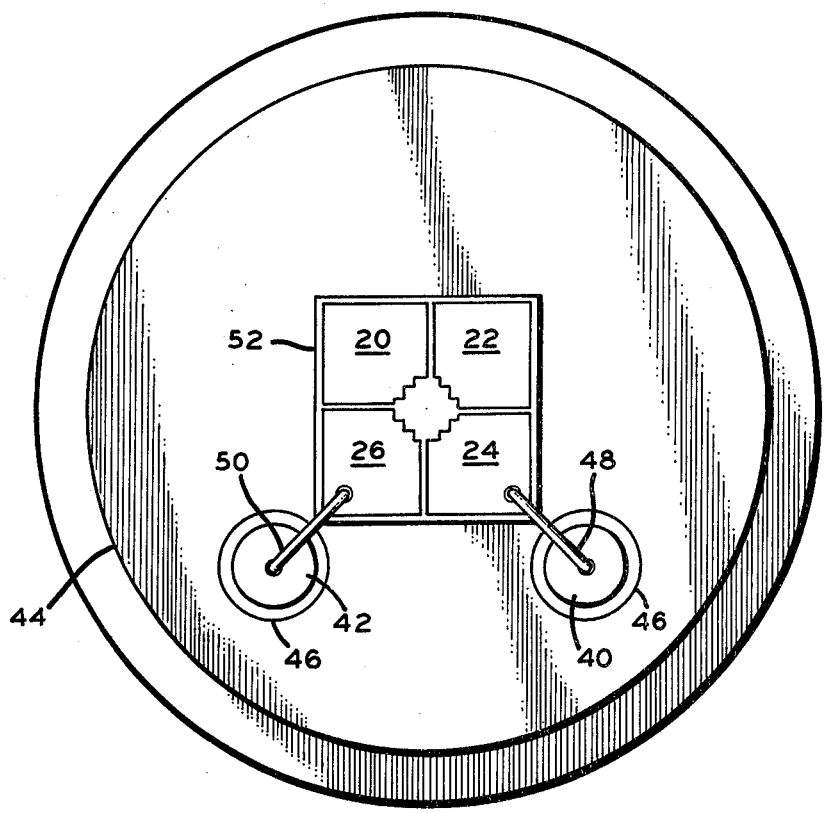
FIG. 1A is a plan view of a thermopile showing the base on which the thermopile is mounted with the detail of the thermocouple structure not shown.

As shown in FIG. 1A, the completed thermopile 10 is then attached to a gold plated base member 44 by cementing the silicon-supporting frame 52 to the base member 44. A conductive epoxy has been found to be a suitable adhesive for attaching the two together. The base member 44 is provided with an aperature 62 therethrough which is in alignment with the aperature 56 in the supporting frame 52.

Figure 3:
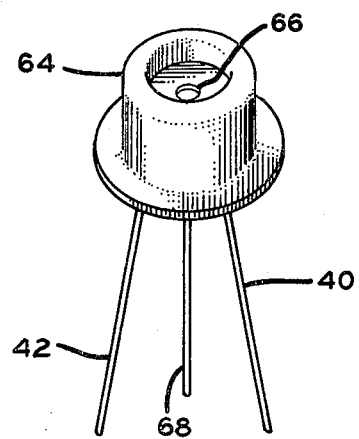
FIG. 3 is an isometric view of a completely encased thermopile.

To complete the electrical connections to the thermopile, the wire 50 is attached to the contact area 26 by a thermocompression ball bond, and connected to the end of the lead 42 by a thermocompression wedge bond. Similarly, the contact area 24 is connected by the wire 48 to the lead 40. FIG. 3 shows a completed thermopile detector constructed in accordance with the invention with a cap 64 secured to the base 44. In the cap 64 is a small central hole 66 to admit radiation to be measured. In addition to the thermopile leads 40 and 42 there is additionally shown in FIG. 3 a ground lead 68 which is electrically attached to the bottom of the base 44.

Thermopiles constructed in accordance with the teachings of this invention are particularly advantageous in that they have an extremely small time constant and a high output for a given received radiation. These characteristics are achieved through the method of manufacturing the thermopile and the physical arrangements of the parts. The extremely small size of the conductors contribute largely to the very fast response of the device. A thermopile so constructed with the areas 20, 22, 24 and 26 producing a square outline having a dimension of one tenth of an inch and lead dimensions as set forth above has been found to have a time constant of 10 msec whereas prior art devices such as disclosed in the aforementioned U.S. Pat. No. 3,424,624 have been reported to have time constants ranging from 130 to 160 msec. The relatively large output from the thermopile is in large measure due to the physical layout of the thermocouple junctions and the small dimensions and the precision of forming the leads which provide a maximum number of hot junctions 12 within the specified target area. Thermopiles constructed in accordance with this invention have been found to have an output of 20 volts per watt of received radiant energy.

The above description of the method of manufacturing the individual thermopiles is generally carried out by manufacturing a plurality of thermopiles on a single wafer of silicon material. When multiple thermopiles are manufactured at one time on a single silicon wafer, the etch mask that is used to expose the photoresist for subsequent etching of the aperatures 56 in the silicon wafers 52 also include provisions to simultaneously expose the photoresist to etch cleavage lines between each of the individual thermopiles. As a result of such provisions, the supporting frame 52 would have at its edges material etched away to produce the slanted surfaces 70 and 72, as shown in FIG. 2. This permits the individual thermopiles then to be separated along well-defined cleavage lines.

The foregoing description has indicated that the thermocouple junctions are formed by joining constantan and Nichrome wires. It is to be understood that such materials are merely used to be illustrative, and other conductors could be used to produce the thermocouple junctions. In view of the extremely small physical dimensions of the conductors extending between the hot and cold junctions, consideration must be given not only to the thermoelectric effect between the two different wires but also to the resistivity of the materials selected. It is well-known to those skilled in the art that high Seebeck coefficients exist for bismuth and antimony. However, such materials have an extremely high resistivity and are not well suitable for use in thermopiles of the type manufactured in accordance with this invention. A thermopile constructed in accordance with the teachings of this invention has been measured to have an impedance in the order of 1400 ohms. It will be understood that a low inpedance is desired in order to keep the Johnson noise low to provide a large signal-to-noise ratio for the system.

What is claimed is:

1. The method of fabricating a high performance solid-backed thin film thermopile using the steps of
    depositing on one surface of a crystalline wafer having a (1-0-0) crystal orientation a thin film of insulating material,
    depositing on said insulating material a plurality of serially connected thermocouples formed of dissimilar conducting materials with a series of junctions located in a central portion of said wafer and intermediate junctions spaced from and circumferentially distributed outside said central portion and
    anisotropically etching said water material from said insulating material in said central portion to remove said wafer material in said central portion to cause said series of junctions in said central portion to be supported solely by said thin film of insulating material.

2. The method of fabricating a high performance solid-backed thin film thermopile using the steps of
    depositing on one surface of a silicon wafer having a (1-0-0) crystal orientation a thin film of borosilicate glass,
    annealing said silicon wafer and deposited glass,
    depositing on said glass a plurality of serially connected thermocouples formed of dissimilar conducting materials with a series of junctions located in a central portion of said wafer and intermediate junctions spaced from and distributed about the perimeter of said central portion and
    selectively removing said silicon from said glass in said central portion by an orientation dependent etch to produce a central opening having a substantially rectangular shape sharply defined by the (1-1-1) planes of said silicon wafer.

3. The method of claim 2 in which the steps of depositing said thermocouples comprises
    depositing a first pattern of a plurality of straight fine leads of a first conducting material on said glass with each lead terminating in substantially square enlarged pad areas, and
    depositing a second pattern of a plurality of straight fine leads of a second conducting material on said glass with each lead terminating in substantially square enlarged pad areas with selected ones of said pad areas of said second material overlaying selected ones of said pad areas of said first material to form said thermocouple junctions.

4. The method of claim 3 which additionally includes the step of depositing large discrete areas of highly reflective conductive material to select ones of said pad areas to establish electrical connections between electrically isolated sections of said thermopile and output connections for said thermopile and to reduce the temperature of said wafer by reflecting stray radiation from said pad areas to maintain said intermediate junctions at a relatively low temperature.

5. The method of claim 4 in which the step of depositing large discrete areas of highly reflective conductive material also deposits smaller areas associated with said intermediate junctions.

6. An improved high-performance solid-backed thermopile for use in a radiation responsive temperature measuring device comprising
    a substrate formed of a thin film of insulating material,
    a support frame for said substrate having a substantially rectangular central aperature therethrough,
    a plurality of first thermocouple junctions deposited on the surface of said substrate in a target area within the area corresponding with the central aperature of said support frame,
    a plurality of second thermocouple junctions deposited on the surface of said substrate in the area supported by said support frame, and
    a plurality of thermocouple leads connecting said hot and said cold junctions alternately in series circuit relation, said leads at said hot junctions lying in a plane corresponding with the surface of said insulating film and being substantially perpendicular to each other
    whereby said hot junctions are distributed through said target area and the number of hot junctions that may be located in said target area is maximized for any preselected thermocouple lead spacing and target area.

7. An improved high-performance solid-backed thermopile as set forth in claim 6 in which said thermocouple leads are disposed in a pattern along straight lines and each said straight line includes two hot junctions.

8. An improved high-performance thermopile for use as a radiation pyrometer comprising
    a target area defined by a radiation receptor,
    a frame spaced from and surrounding said target area,
    a plurality of first thermocouple leads located in a plane,
    a plurality of second thermocouple leads located in said plane,
    a plurality of hot thermocouple junctions formed within and distributed through said target area by first junctions of said first and said second thermocouple leads with said leads connected to each of said hot junctions at substantially right angles to each other and
    a plurality of cold thermocouple junctions within an area defined by said frame formed by other junctions of said two dissimilar thermocouple leads with said leads connected to said cold junctions substantially parallel to each other.

9. Apparatus as set forth in claim 8 in which said thermocouple leads are in a pattern of substantially mutually perpendicular straight lines in which each said straight line includes two of said hot junctions and dissimilar thermocouple leads along different line segments of said straight line.

* * * * *